(12) United States Patent
Johnston et al.

(10) Patent No.: US 7,335,587 B2
(45) Date of Patent: Feb. 26, 2008

(54) POST POLISH ANNEAL OF ATOMIC LAYER DEPOSITION BARRIER LAYERS

(75) Inventors: Steven W. Johnston, Portland, OR (US); Kevin P. O'Brien, Portland, OR (US); Sridhar Balakrishnan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 121 days.

(21) Appl. No.: 11/173,858

(22) Filed: Jun. 30, 2005

(65) Prior Publication Data

US 2007/0004230 A1 Jan. 4, 2007

(51) Int. Cl.
*H01L 21/44* (2006.01)
(52) U.S. Cl. ............... 438/637; 438/643; 438/653; 438/656; 257/E21.575

(58) Field of Classification Search ................ 438/637, 438/643, 653, 656
See application file for complete search history.

(56) References Cited

U.S. PATENT DOCUMENTS

| 6,319,809 | B1 * | 11/2001 | Chang et al. ............... 438/597 |
| 2005/0009325 | A1 * | 1/2005 | Chung et al. ............... 438/637 |
| 2006/0118955 | A1 * | 6/2006 | Liu ............................. 257/753 |
| 2006/0216952 | A1 * | 9/2006 | Bhanap et al. .............. 438/780 |

* cited by examiner

*Primary Examiner*—Asok K. Sarkar
*Assistant Examiner*—Victor V. Yevsikov

(57) ABSTRACT

A method for forming a semiconductor device is disclosed wherein atomic layer deposition (ALD) precursor species and/or by-product absorbed by an ILD are outgassed and/or neutralized prior to subsequently patterning the semiconductor device, thereby improving the ability to accurately define subsequently formed interconnect structures in the ILD.

17 Claims, 5 Drawing Sheets

POST POLISH ANNEAL OF ATOMIC LAYER DEPOSITION BARRIER LAYERS

FIELD OF THE INVENTION

Embodiments of the present invention relate generally to semiconductor technology and more specifically to semiconductor device fabrication.

BACKGROUND OF THE INVENTION

Copper interconnect fabrication typically involves forming a damascene opening in an interlayer dielectric (ILD) followed by sequential blanket film depositions of barrier, seed, and copper fill materials. Upon removal of barrier, seed, and copper fill materials not contained within the damascene opening, the interconnect structure is formed.

Conventional methods for forming the barrier include using a physical vapor deposition (PVD) process to deposit tantalum and/or tantalum nitride within the trench opening. This approach has been effective in forming interconnect's having line widths greater than approximately 100 nanometers (nm). However below 100 nm, the barrier thickness does not scale proportionately and problems can be encountered. These problems are the result of minimum thickness limitations due to the inherent non-uniformity/non-conformality of PVD deposited films.

Continuing to reduce the barrier's thickness to accommodate interconnect scaling below 100 nm can result in barrier thinning to a point where the barrier's integrity is compromised, in which case device reliability can be a concern. On the other hand, failing to proportionately scale the barrier can result in it occupying an increasingly larger percentage of the interconnect's overall volume. In this case, since the barrier typically has a higher resistance than that of the copper seed and/or fill material, the interconnect's resistance will increase.

Barriers formed using atomic layer deposition (ALD) are an alternative to PVD barriers in scaled interconnect technology. ALD is capable of depositing thinner, more conformal, and more uniform barrier films as compared to PVD. However, depositing ALD barrier films on materials such as low dielectric constant (low-k) ILDs is feasible but not without taking precautions. This is because during deposition, ALD precursors can absorb into the ILD's bulk and then eventually outgas and create problems during subsequent patterning processes. Current methods for addressing include sealing the ILD surface before or after ALD barrier deposition/removal. However this may be impractical or undesirable because it adds processing steps and it can require the use of films which increase the ILD's overall dielectric constant.

Figure 1:
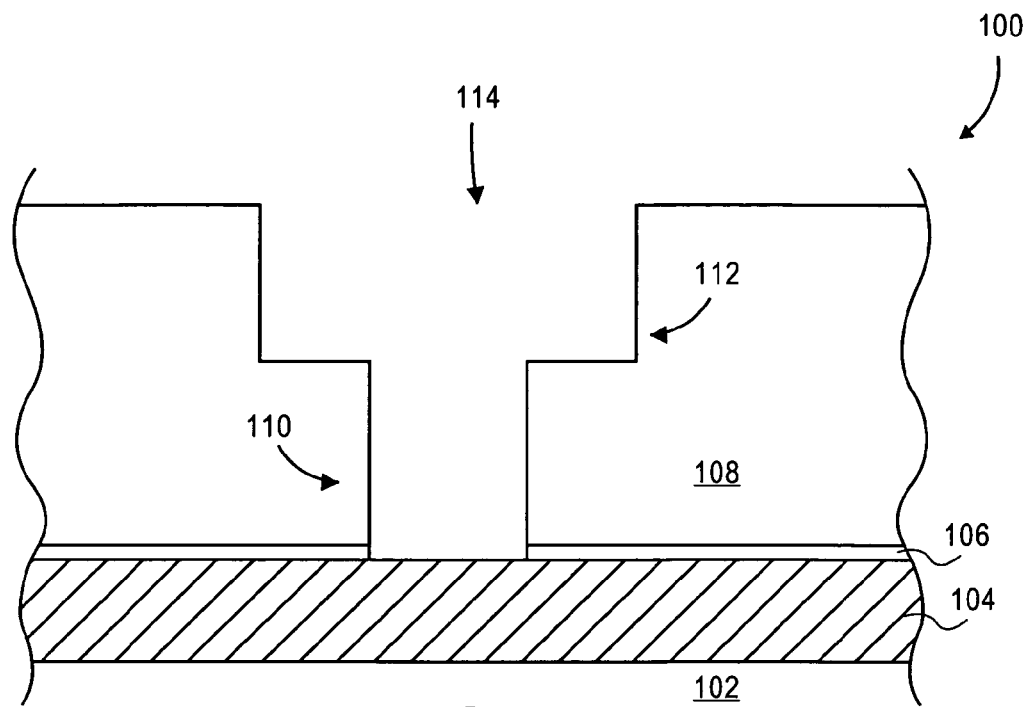
FIGS. 1-3 and 5-7 illustrates cross-sectional views showing formation of an interlayer dielectric in accordance with an embodiment of the present invention.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, an interconnect barrier and its method of formation are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one layer or element relative to other layers or elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

In one embodiment, an interlayer dielectric (ILD) that that includes an atomic layer deposition (ALD) barrier is post-polish annealed in an inert ambient to outgas ALD by-products absorbed by the ILD. The anneal can alternatively be carried out in an ambient capable of chemically neutralizing ALD byproducts absorbed by the ILD. The ILD can be any ILD used to fabricate damascene interconnects. In one specific embodiment the ILD is a porous low-k ILD. At least one embodiment of the present invention facilitates the formation of ALD barriers formed with amine-containing precursors such as pentakis (dimethylamide) tantalum (PDMAT) and tertbutylimido (trisdiethylamide) tantalum (TBTDET). Outgassing and/or neutralization of the byproducts reduces/eliminates occurrences of resist poisoning that can impact subsequent patterning processes. Aspects of these and other embodiments will be discussed herein with respect to FIGS. 1-7, below. The figures, however, should not be taken to be limiting, as they are intended for the purpose of explanation and understanding.

Shown in FIG. 1 is an illustration of a partially fabricated semiconductor device 100. The semiconductor device 100 includes one or more base layers 102. Under the base layers 102 is a substrate (not shown) which is typically a semiconductor wafer. The substrate typically includes silicon, silicon germanium, gallium arsenide or other III-V compounds, silicon carbide, silicon on insulator (SOI), or the like.

The base layers 102 typically includes a combination of dielectric, semiconductive, and/or conductive layers that have been photolithographically patterned and etched to form semiconductor device features over, on, or within the substrate. For example, region 102 may include dielectric layers/features that include one or more of silicon nitride, silicon dioxide, tetraethylorthosilicate (TEOS), borophosphosilicate glass (BPSG), spin on glass (SOG), low-k materials, high-k materials, or the like. The region 102 may also contain semiconductive features that include one or more of epitaxial silicon, polysilicon, amorphous silicon, doped polysilicon, or the like. In addition, the multi-layer region 102 can also include conductive or metallic features that include one or more of refractory silicides, refractory metals, aluminum, copper, alloys of these materials, conductive nitrides, conductive oxides, or the like.

Overlying region 102 is a conductive structure 104. The conductive structure 104 is optional and can be, for example, an interconnect, a conductive plug, or the like. The conductive structure 104 can include adhesion layers, barrier layers, seed layers and conductive fill materials formed from materials that include refractory metals, silicides, aluminum, copper, conductive nitrides, conductive oxides, alloys of these materials, or the like. Conductive structure 104 may be electrically connected to some portions of region 102 and electrically insulated from other portions of region 102.

Overlying the conductive structure 104 is an optional etch stop layer (ESL) 106. The etch stop layer 106 typically, but not necessarily, includes one or more of silicon nitride, silicon oxynitride, or a silicon-rich-silicon-nitride. The etch stop layer is typically deposited using chemical vapor deposition (CVD), plasma-enhanced chemical vapor deposition (PECVD), or the like.

Over the etch stop layer 106 is an interlayer dielectric (ILD) 108. The ILD 108 can include silicon dioxide, fluorinated silicon dioxide, low-k dielectrics, such as porous low-k dielectrics, carbon-doped dielectric materials, organic polymers, inorganic polymers, blends of organic/inorganic polymers, and the like. The ILD 108 can be deposited using chemical vapor deposition methods (CVD), spin-on methods, or the like. In one specific embodiment, the ILD 108 is a plasma enhanced CVD deposited carbon-doped low-k dielectric. Examples of such carbon-doped dielectrics include Black Diamond® produced by Applied Materials, Inc. of Santa Clara, Calif.; Coral® produced by Novellus Systems, Inc. of Santa Clara Calif.; Aurora® 2.7 and ultra low k (ULK) produced by ASM of Bilthoven, the Netherlands; variants thereof, or the like. As shown in FIG. 1, a dual damascene opening 114, which includes a trench opening portion 112 and a via opening portion 110 has been formed in the ILD 108. The trench opening can be formed using conventional methods.

Figure 2:
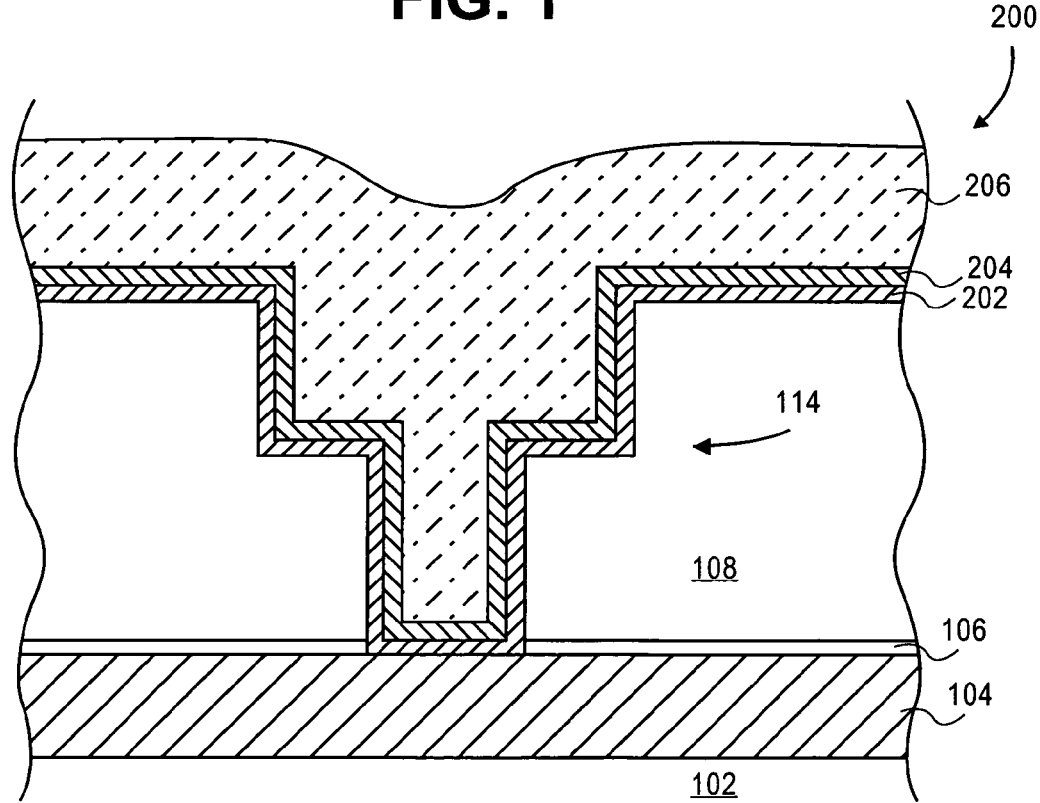

Turning now to FIG. 2, a cross-sectional view 200 of the partially fabricated semiconductor device of FIG. 1 is shown after a barrier layer 202, a seed layer 204, and a conductive fill material 206 have been deposited in the dual damascene opening 114. In accordance with one embodiment, the barrier 202 is a refractory metal nitride deposited using ALD. In one specific embodiment, the barrier is an ALD deposited tantalum nitride (TaN) film deposited using a tantalum-containing precursor such as tertbutylimido (tris-diethylamide) tantalum (TBTDET), pentakis (diethylamide) tantalum (PDEAT), pentakis (dimethylamide) tantalum (PD-MAT), pentakis (ethylmethylamino) tantalum (PEMAT), tertiaryamylimidotris (dimethylamido) tantalum (Taimata®), $TaCp_2H_3$, $TaCl_5$, or the like, and a nitrogen-containing precursors, such as ammonia (NH3) or an amine (NH2R, NHR2, or NR3). Typically the barrier thickness is in a range of 10-50 Angstroms.

The seed layer 204 is deposited over the barrier 202. It can be deposited using physical vapor deposition (PVD), ALD, or the like. Seed layers typically include conductive materials onto which the conductive fill material 206 can be electroplated. For example, the seed layer 204 can comprise noble metals such as ruthenium (Ru), copper, or copper-alloy materials. In one specific embodiment, the seed layer 204 is PVD deposited copper having a thickness in a range of 100-1000 Angstroms. Next, fill material 206 is deposited over the seed 204. Typically, the fill material 206 includes include copper, aluminum, or alloys of copper or aluminum, or the like. In one embodiment, the fill material 206 is a copper-containing material that has been electroplated onto the seed using conventional processing. The fill material is deposited such that its thickness is sufficient to completely fill the opening 114. One of ordinary skill appreciates that in alternative embodiment where the fill material can be deposited directly onto the barrier, the seed layer may be optional.

Figure 3:
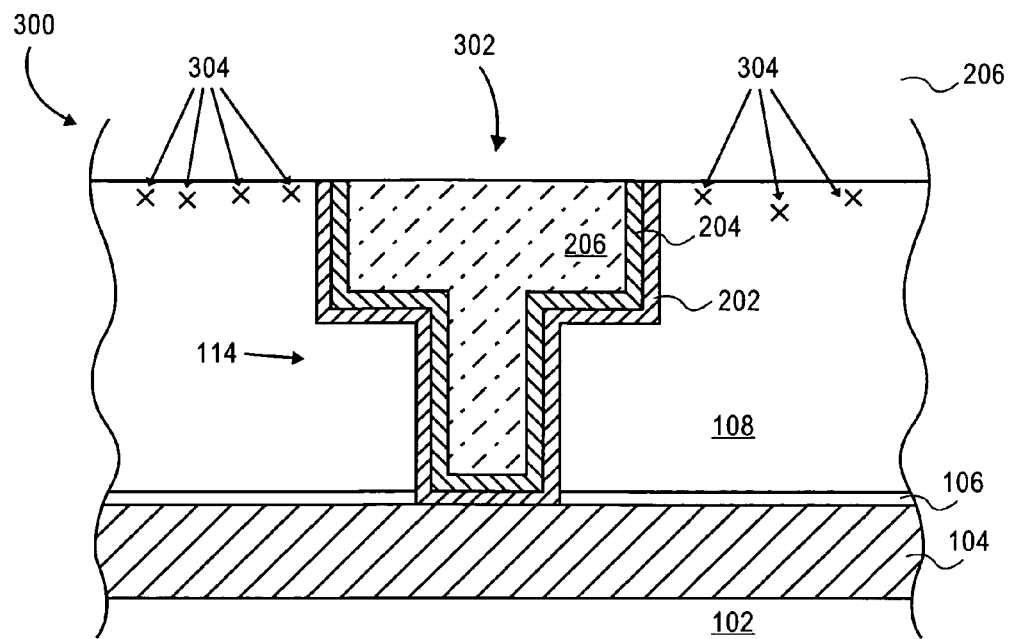

Turning now to FIG. 3, a cross-sectional view 300 of the partially fabricated semiconductor device of FIG. 2 is shown after excess material (i.e. excess fill 206, seed 204, and barrier 202) has been removed from the surface of ILD 108. Excess material, as used herein refers to those portions of fill, seed, and barrier layer materials not substantially contained within the opening 114. In accordance with one embodiment, excess material is removed using a conventional copper/barrier chemical mechanical polishing (CMP) process. Alternatively, the excess material can be removed using an electropolish process.

However, as can be seen in FIG. 3, contaminants, such as residual precursor species and/or byproducts 304 (e.g. ALD amine and/or ammonia precursors and/or precursor byproducts) can absorb into the ILD and may not be removed by the CMP process. The contaminant 304 source are believed to be amines from one (or both) of the tantalum-containing precursor or the nitrogen-containing precursor. And, in embodiments where the ILD 108 is a porous ILD, such as for example a porous low-k ILD, the depth and extent of precursor contaminant absorption can be significant.

Figure 4:
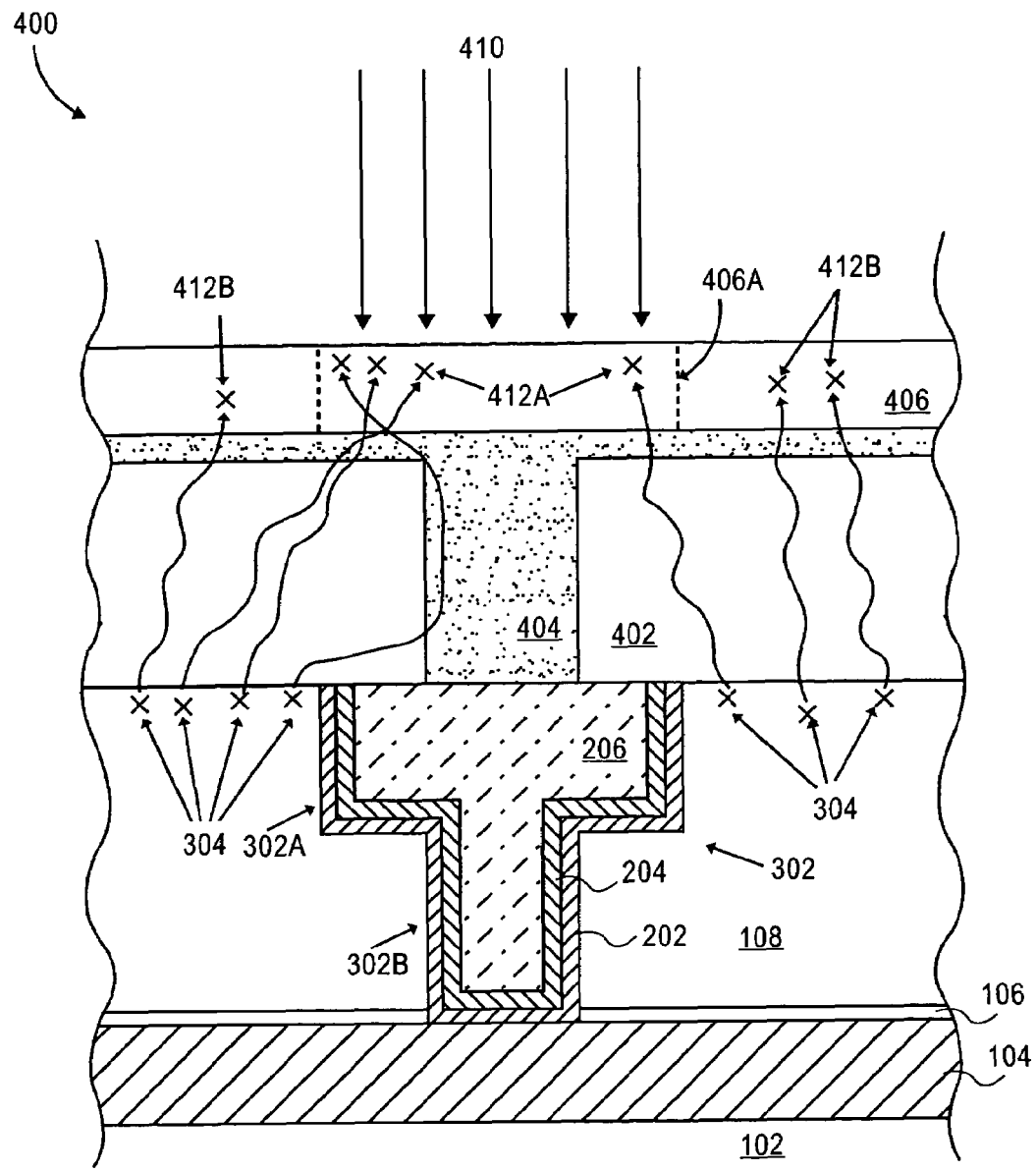
FIG. 4 illustrates a cross-sectional view showing the migration of amines from a lower interlayer dielectric into a resist layer overlying an upper dielectric.

Turning now to FIG. 4, a cross sectional view 400 is provided which illustrates why and how the residual precursor contaminants 304 can be problematic. As shown in FIG. 4, during processing to form next level interconnects, the residual precursor contaminants 304 can migrate/diffuse through, for example, an overlying dielectric layer 402 and/or a sacrificial light absorbing material (SLAM) 404 and into an overlying photoresist layer 406 and form contaminants 412A and 412B. To the extent that the residual precursor contaminants 304 diffuse/migrate into resist portions 406A (i.e., shown as contaminants 412A located in the regions between the dashed lines) that are to be patterned (i.e., exposed and developed away), they can interfere with the resists ability to react with exposure radiation 410 and thereby subsequently result in under and/or undeveloped resist areas. This can ultimately lead to the formation of areas of blocked etch during, for example as here, the formation of the trench portion of the dual damascene opening. This problem can be mitigated by forming an intervening diffusion barrier layer (not shown), for example, a silicon nitride containing layer, between ILDs 402 and 108. However, to the extent that the intervening diffusion barrier layer is incapable of blocking the diffusion/migration of the residual precursors 304 and/or to the extent that, as shown here, a via-first processing integration scheme is used to form the damascene structure and the ILD 108 is exposed (exposure of ILD 108 would of course occur to a greater extent in an unlanded via integration scheme (not shown)), then the intervening layer may not be effective in preventing the diffusion/migration of the residual precursors 304.

Figure 5:
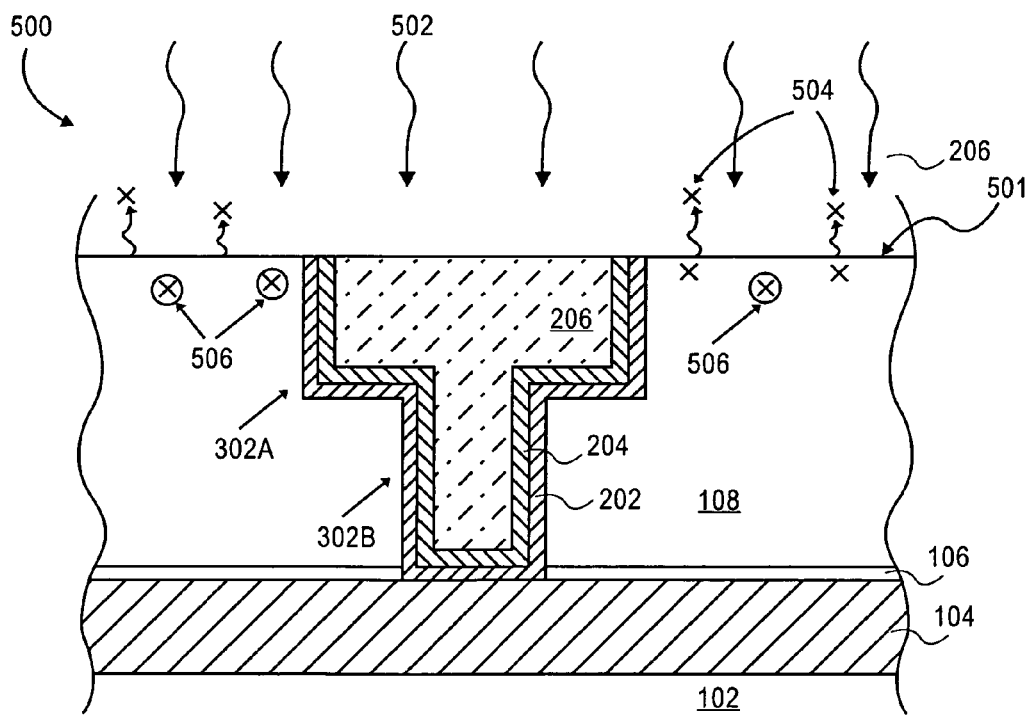

Turning now to FIG. 5, a cross-sectional view 500 of the partially fabricated semiconductor device of FIG. 3 is shown during processing in accordance with an embodiment of the present invention. In this embodiment, a post CMP anneal is performed. In this way problems with diffusion/migration of precursor contaminants can be reduced. In one embodiment, the post CMP anneal (indicated by arrows 502) is performed while the field portions 501 of the ILD 108 are exposed (i.e. after removing excess barrier material). The anneal can be performed in an inert ambient, such as nitrogen or hydrogen-containing ambient, in which case precursor contaminants 504 are removed as the result of outgassing from the ILD 108. Alternatively, the anneal can be performed in an ambient that contains a precursor neutralizing species (e.g., in embodiments where the precursor contaminant being removed/neutralized is an amine, then a dilute amine neutralizing gas, such as an acetic acid gas can be added to the ambient during the thermal anneal). The anneal can be performed on individual wafers using a rapid thermal anneal or alternatively it can be performed on single or multiple wafers using a furnace. Typically, the annealing process is carried out in a furnace at a time and temperature in a range of approximately 5-120 minutes and 100-400 C, respectively. One of ordinary skill appreciates however that these times can vary depending on the degree of outgassing and/or neutralization desired. In this way (i.e., annealing in an ambient-containing a precursor neutralizing species), some precursor contaminants 304 (shown in FIG. 3) can be neutralized to form inert species 506 that will not substantially diffuse/migrate into subsequently formed resist layers, some precursors can be neutralized so even if they do diffuse to the resist layer, they will have reduced interactions with the patterning process, and some precursor contaminants may outgas from the ILD 108 altogether and form volatile species 504 that can desorb from the ILD surface. In any case, the removal and/or neutralization of amines can reduce instances of resist poisoning (i.e. instances where the precursor contaminants diffuse/migrate into the resist and interfere with its ability to react with exposure radiation during the patterning process).

Figure 6:
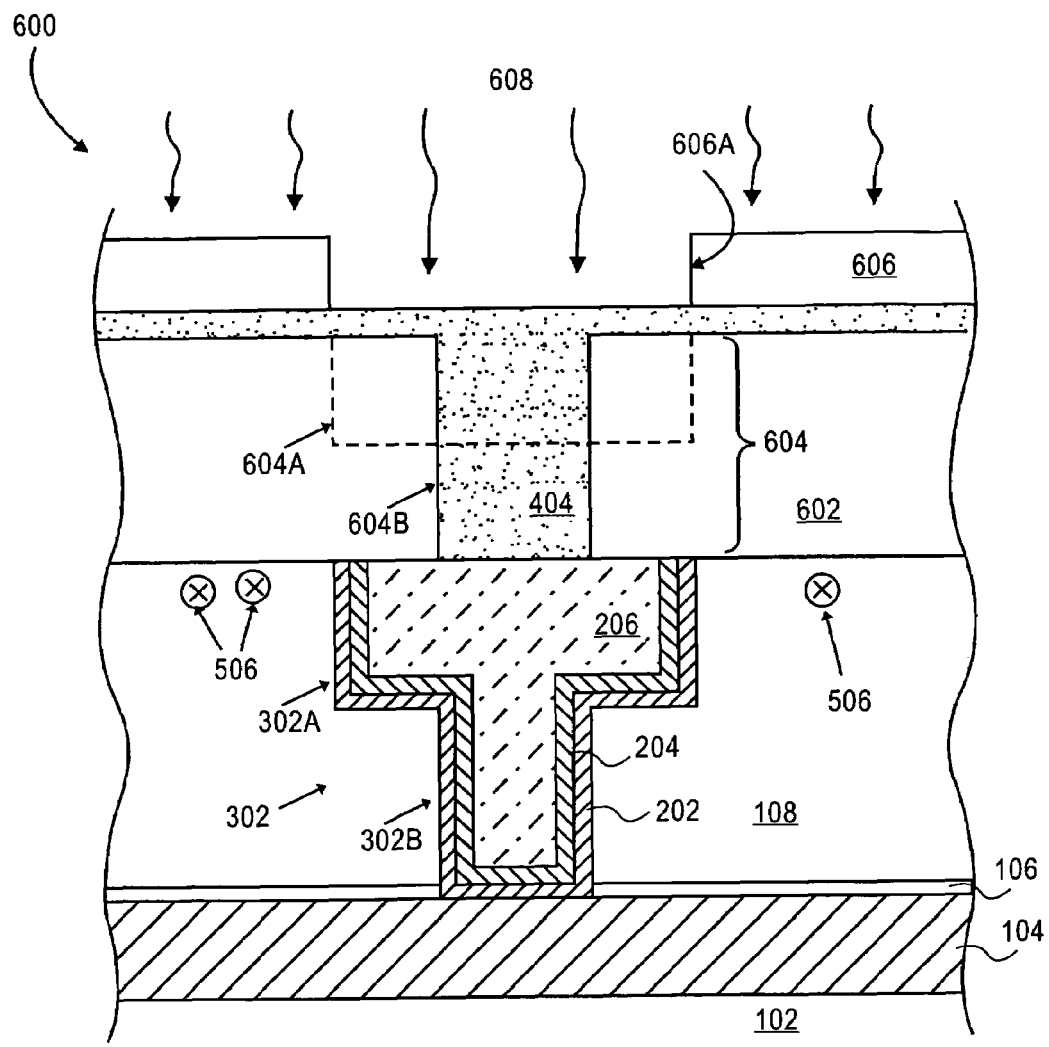

Turning now to FIG. 6, a cross-sectional view 600 of the partially fabricated semiconductor device of FIG. 5 is shown during an intermediate step in forming a damascene opening 604 for a subsequent level of interconnects. As shown in FIG. 6, an ILD 602 has been formed over the interconnect 302 and ILD 108. A via opening 604B has been patterned and etched in the ILD 602 and filled with a SLAM 404. Photoresist 606 is patterned over the ILD 602 to form an opening 606A that exposes portions of the SLAM 404. Then, portions of the SLAM 404 (and ILD 602) that are or will be exposed by the opening 606A can be etched by an etchant 608. Upon completion of the etch, a trench opening, approximated by the dashed line 604A, is formed. And, in accordance with one or more of the embodiments herein, the fidelity of the via and trench patterning processes are improved as the result of outgassing and/or neutralization of the precursor defects.

Figure 7:
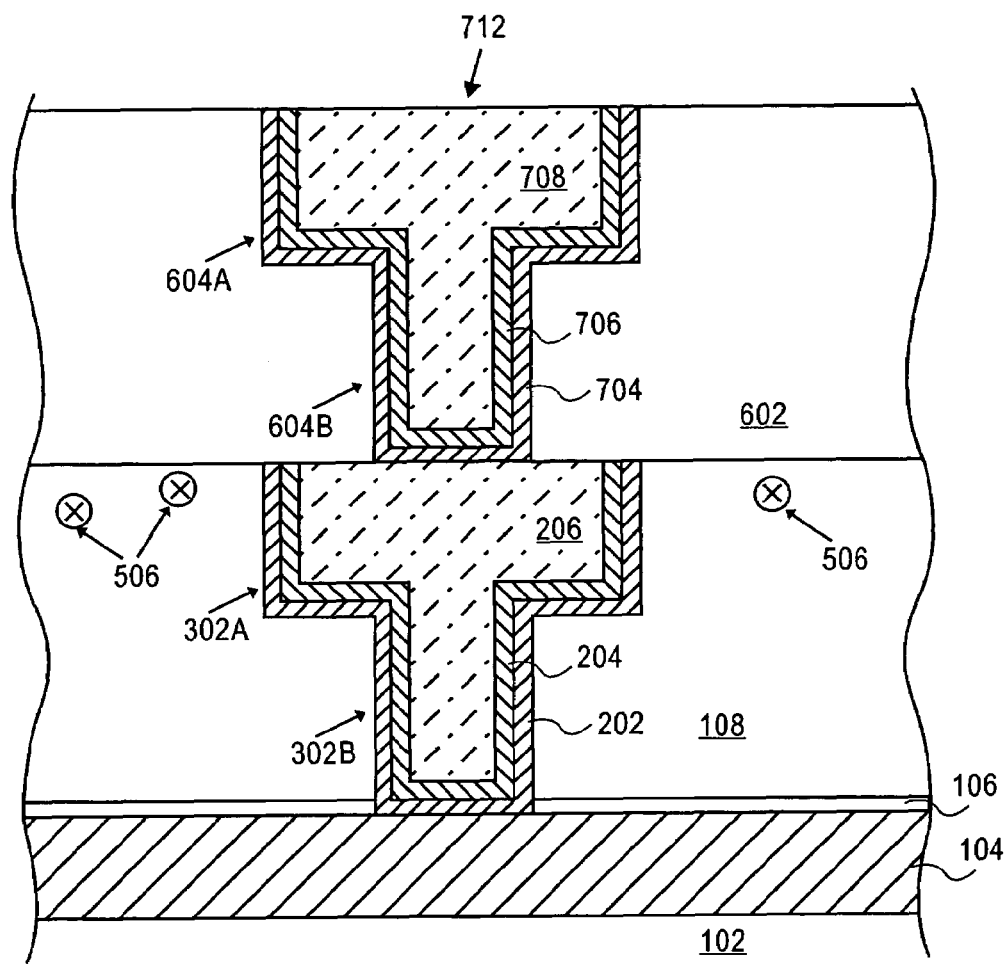

Turning now to FIG. 7, a cross-sectional view 700 of the partially fabricated semiconductor device of FIG. 6 is shown after a barrier 704, seed 706, and fill material 708 have been deposited in trench 604A and via 604B to form a dual-damascene interconnect 712. The barrier 704 can be deposited using ALD, PVD, or the like, and the seed and fill materials can be deposited using conventional methods. Here, like barrier 202, the barrier 704 can include materials such as tantalum nitride (TaN), titanium nitride (TiN), titanium tungsten (Ti/W), noble metals, such as for example ruthenium (Ru), composites thereof, or the like; the seed layer 706 can comprise noble metals such as ruthenium (Ru), copper, or copper-alloy seed materials; and the bulk conductive material can include copper, aluminum, or alloys of copper or aluminum, or the like. Excess barrier, seed, and conductive fill material is removed using chemical-mechanical-planarization or electropolish to form the dual-damascene interconnect 712. Because precursor contaminants previously absorbed in ILD 108 have been removed by way of outgassing and/or been neutralized, problems related to ALD precursor diffusion/migration have been reduced. Processing thereafter is considered conventional to one of ordinary skill in the art. Additional layers of interconnects, ILDs, bond pad structures, etc., as known to one of ordinary skill may be formed to fabricate a semiconductor device.

The various implementations described above have been presented by way of example and not by way of limitation. Thus, for example, while embodiments disclosed herein teach the formation of barriers fabricated using amine-containing ALD precursor species, one of ordinary skill appreciates that embodiments of the present invention can also be used to outgas and/or neutralize other ALD precursor species absorbed by interlayer dielectrics. In addition, while the use of an anneal is disclosed, one of ordinary skill appreciates that embodiments of the present invention include other means for neutralizing/removing precursor contaminants. Such other means can include for example wet or dry etch processes capable of reacting with and/or removing precursor contaminants from ILDs that have had ILD barriers deposited thereon.

Having thus described in detail embodiments of the present invention, it is understood that the invention defined by the appended claims is not to be limited by particular detailed set forth in the above description, as many apparent variations thereof are possible without departing from the spirit or scope thereof.

What is claimed is:

1. A method for forming a semiconductor device comprising:
    depositing an atomic layer deposition (ALD) barrier film over an interlayer dielectric (ILD) layer;
    depositing a copper-containing fill material onto the ALD barrier film;
    removing excess portions of the ALD barrier film and the copper-containing fill material from a surface of the ILD layer using a chemical mechanical polishing (CMP) process, thereby exposing at least a portion of the surface;
    annealing the ILD layer after the CMP process to outgas an ALD precursor species and/or by-product absorbed by the ILD layer.

2. The method of claim 1, wherein the ILD layer is further characterized as a porous interlayer dielectric and/or a carbon-doped interlayer dielectric.

3. The method of claim 1, wherein at least one of the ALD precursor species and/or byproduct is further characterized as a nitrogen-containing precursor species and/or byproduct.

4. The method of claim 3, wherein the nitrogen-containing precursor species and/or byproduct includes an amine.

5. The method of claim 1, wherein a precursor used to deposit the atomic layer deposition barrier film includes tantalum.

6. The method of claim 5, wherein the atomic layer deposition film is further characterized as a tantalum nitride film, and wherein a tantalum-containing precursor used to deposit the tantalum nitride film is selected from a group consisting or pentakis (dimethylamide) tantalum, tertbutylimido (trisdiethylamide) tantalum, pentakis (diethylamide) tantalum, pentakis (ethylmethylamino) tantalum, and tertiarya mylimidotris (dimethylamido) tantalum.

7. The method of claim 1, wherein annealing is further characterized as annealing in an ambient-containing a gas capable of chemically neutralizing atomic layer deposition precursors and/or by-products absorbed by the interlayer dielectric.

8. The method of claim 7, wherein the gas is further characterized as an amine neutralizing gas.

9. The method of claim 8, wherein the amine neutralizing gas contains acetic acid.

10. The method of claim 1, further comprising depositing a seed layer over the barrier prior to depositing the fill material, wherein removing also removes excess seed layer material.

11. The method of claim 10 further comprising forming an intervening barrier layer between the ILD layer and the upper interconnect.

12. The method of claim 1 further comprising patterning an upper interconnect in a second dielectric deposited overlying the ILD layer.

13. The method of claim 1, wherein annealing is performed in a furnace at a temperature in a range of 100-400 C.

14. A method for forming a semiconductor device comprising:
   depositing an atomic layer deposition (ALD) film over a carbon doped interlayer dielectric;
   depositing a fill material onto the ALD film;
   removing portions of the ALD film and the fill material from a surface of the carbon doped interlayer dielectric using a chemical mechanical polishing (CMP) process, thereby exposing at least a portion of the surface, and;
   annealing the carbon doped interlayer dielectric after the CMP process to neutralize an ALD precursor species and/or by-product absorbed by the carbon doped interlayer dielectric.

15. The method of claim 14, wherein annealing is further characterized as annealing in an ambient-containing a gas capable of chemically neutralizing the ALD precursors and/or by-products.

16. The method of claim 15, wherein the gas is further characterized as a dilute amine-neutralizing gas.

17. The method of claim 16, wherein the amine-neutralizing gas is further characterized as an acetic acid containing gas.

* * * * *